United States Patent

Horikawa et al.

[19]

[11] Patent Number: 5,991,005
[45] Date of Patent: Nov. 23, 1999

[54] STAGE APPARATUS AND EXPOSURE APPARATUS HAVING THE SAME

[75] Inventors: Hiroto Horikawa; Yutaka Hayashi, both of Kanagawa-ken, Japan

[73] Assignee: Nikon Corporation, Tokyo, Japan

[21] Appl. No.: 08/826,380

[22] Filed: Apr. 9, 1997

[30] Foreign Application Priority Data

Apr. 11, 1996 [JP] Japan .................................... 8-114192
May 31, 1996 [JP] Japan .................................... 8-161170

[51] Int. Cl.$^6$ .......................... G03B 27/42; B23Q 16/00; H01L 21/27
[52] U.S. Cl. ............................... 355/53; 355/72; 356/399
[58] Field of Search ................................ 355/53, 75, 72; 33/568; 356/358, 363, 399, 400, 401, 393

[56] References Cited

U.S. PATENT DOCUMENTS

| | | | |
|---|---|---|---|
| 4,999,669 | 3/1991 | Sakamoto et al. ......................... | 355/53 |
| 5,040,431 | 8/1991 | Sakino et al. .............................. | 74/479 |
| 5,204,712 | 4/1993 | Bouwer et al. ............................ | 355/53 |
| 5,280,677 | 1/1994 | Kubo et al. ............................... | 359/393 |
| 5,376,988 | 12/1994 | Osanai ...................................... | 355/53 |
| 5,524,502 | 6/1996 | Osanai ................................. | 74/490.07 |

FOREIGN PATENT DOCUMENTS 7-161799  6/1995  Japan .

OTHER PUBLICATIONS

U.S. application No. 08/350,173 filed on Nov. 30, 1994, pending.

*Primary Examiner*—Alan A. Mathews
*Attorney, Agent, or Firm*—Armstrong, Westerman, Hattori, McLeland, & Naughton

[57] ABSTRACT

A stage apparatus comprising a support device for supporting a table at its center of gravity and a drive device for driving the table at positions apart from the center of gravity of the table without contacting with the table. The stage apparatus effectively reduces stresses created in the table and/or any thermal deformation of the table. The table is connected to three pairs of table support bars on the stage through three respective plate springs so as to minimize any harmful deformation of the table, which could otherwise occur when the table is driven for motion or displacement in the Z-direction or for adjustment of the tilt of the table. The stage apparatus includes three drive units with respective drive pins for driving the stage. For example, when the three drive pins are driven simultaneously by the associated drive units, the table is caused thereby to translate along the Z-axis. The drive pins are so arranged as to provide support for the table at support points just under respective securing points on the table at which the table is secured to the plate springs and to provide a drive for the, table in the Z-direction at the support points. Thus, when driven by the drive pins, the table is only subject to compression forces acting thereon in the Z-direction and not to any moment.

26 Claims, 12 Drawing Sheets

STAGE APPARATUS AND EXPOSURE APPARATUS HAVING THE SAME

BACKGROUND OF THE INVENTION

The present invention relates to a stage apparatus for movably mounting a table on a stage, and in particular, to a support mechanism for supporting the table mounted on the stage. More particularly, the present invention relates to a stage apparatus suitable for use in an exposure apparatus, for mounting thereon a photosensitized substrate onto which a pattern formed on a reticle is transferred by exposure through a projection lens.

In a typical stage apparatus for use in an exposure apparatus and the like, a table is movably mounted on a stage at three points which do not lie on a straight line but define a triangle within which the center of gravity of the table lies. Further, the table is driven at these three points in order to provide vertical displacement and/or tilting of the table relative to the stage. The manner in which the table is movably mounted on the stage falls into two general categories: first, direct-contact actuators are used so as to support and drive the table through the direct contacts of the actuators with the table; second, noncontact actuators such as voice coil motors (VCMs) are used for the support and drive purposes.

Unfortunately, in the case where direct-contact actuators are used, stresses may be created within the table by frictional forces occurring at the contact points between the table and actuators. On the other hand, in the case where noncontact actuators such as VCMs are used, the actuators have to be continuously energized to produce vertical thrust forces for bearing the weight of the table, with the result that a considerable amount of heat is generated by the actuators and may affect the table to thereby cause harmful deformation of the table.

As one support structure usable for mounting a stage (or a table), there is used a so-called kinematic structure. Briefly, with the kinematic structure, the stage is supported by the combination of a point, a V-groove and a flat surface. This kinematic structure may be called an ideal support structure because no harmful stress is created within the stage when it is driven for vertical displacements and tilting. Nevertheless, the kinematic structure has a disadvantage in its ability to accommodate the horizontal motion of the stage and is not suitable for use in a case where the support members for the stage themselves are subject to rapid horizontal motion. For this reason, the kinematic structure has not been used for a stage apparatus used in an exposure apparatus.

FIG. 12 shows a schematic exploded perspective view of a typical stage apparatus for use in an exposure apparatus. As shown in FIG. 12, a base or surface plate 600 carries thereon a Y-stage 620 which is driven in the longitudinal direction of the surface plate 600 (or in the Y-direction) by a drive motor 630. The Y-stage 620 in turn carries thereon an X-stage 621 which is driven in the direction perpendicular to the Y-direction (or in the X-direction) by a second drive motor 631. Further, the X-stage 621 carries thereon three table support bars 640, 641 and 642 and three drive pins 720, 721 and 722 such that the table support pins and the drive pins are disposed alternately along a circle at regular angular intervals of 60 degrees. Accordingly, the three table support bars 640, 641 and 642 are disposed on three corner points of a regular triangle, respectively, while the three drive pins 720, 721 and 722 are disposed on the three corner points of another regular triangle, respectively.

A table 660 has three circular holes 670, 671 and 672 formed therein at positions corresponding to the distal (or upper) ends of the three table support bars 640, 641 and 642, respectively. The circular holes 670, 671 and 672 have a diameter slightly greater than that of the table support bars. When the table 660 is attached to the X-stage 621, the distal ends of the table support bars 640, 641 and 642 are inserted into the circular holes 670, 671 and 672, respectively, and then the table support bars 640, 641 and 642 and the table 660 are connected with each other by a ring-shaped plate spring 680 called a "flexure". More specifically, as shown in FIG. 13, the ring-shaped plate spring 680 is secured to the table support bars 640, 641 and 642 by three set screws 701, 703, 705 and to the table 660 by additional three set screws 700, 702 and 704. Thus, six set screws 700–705 in total are used for connecting them with each other. With this arrangement, the plate spring 680 tends to make the top surface of the table 660 coincident with the plane defined by the top (or upper end) surfaces of the table support bars 640, 641 and 642. In this manner, the table 660 is supported on the X-stage 621 by the plate spring 680.

With the table 660 having been thus connected to the X-stage 621, the drive pins 720, 721 and 722 are just under respective screw holes 700a, 701a and 702a formed in the table 660, as shown in FIG. 12. The drive pins 720, 721 and 722 are independently driven by respective drive units 740, 741 and 742 in the direction perpendicular to an XY-plane (or in the Z-direction), so that the table 660 is driven by the three drive pins 720, 721 and 722 at three different support points, such that the position in the Z-direction of the table 660 relative to the X-stage 621 and the tilt angles of the table 660 with respect to an XY-plane may be set to any desired position and angles within limited ranges. The plate spring 680 used here is highly rigid against any horizontal displacement of the table 660 while a low rigidity against any vertical displacement of the table 660 in order to achieve a rapid settling time when a horizontal displacement of the X-stage 621 and/or the Y-stage 620 is made for positioning the table 660.

In general, the flexure (or plate spring), mounted on the stage apparatus as described above and forming a part of an exposure apparatus, has to have rigidities meeting the following two conditions a) and b).

a) The rigidity of the flexure in the Z-direction, Kz, should be set to as small value as possible in the range that suffices the formula below for any possible displacement within the stroke of the table for the focusing and/or levelling operation:

$$M*g > Kz*z$$

where:

M stands for the mass of the table including any parts mounted on the table;

g stands for the acceleration of gravity; and z stands for the displacement of the point at which the table is driven.

b) The rigidities of the flexure in the X- and Y-directions and that in the Zθ-direction (which is the rotational direction about the Z-axis) are selected depending on the control characteristics of the stage, such that these rigidities should be enough to provide satisfactory settling time and control response.

The typical stage apparatus for an exposure apparatus described above uses the ring-shaped plate spring because it meets these two conditions a) and b). However, the use of the ring-shaped plate spring suffers from the following problems.

Since securing points between the table and the plate spring (flexure), and the other securing points between the table and the stage are disposed on the same circle, respectively; the plate spring tends to be deformed due to the force acting thereon in a Z-direction from the table support bars during a focusing and/or levelling operation. However, because the plate spring is highly rigid in the horizontal direction, it resists being stretched so that tensile stress occurs within the plate spring. While, the table, as shown in FIG. 13, is subjected to forces which act in the direction from a securing point between the table and plate spring to the neighboring securing point between the table and stage (these forces are represented by solid line arrows in FIG. 13). Each of the securing points on the table is subjected to two forces, respectively, tangential components of which are balanced each other, and radial components of which serves as a moment tending to deform the table (these radial components of the forces are represented by dotted line arrows in FIG. 13). As a result, the table is subjected to minute deformation (which may be coneshaped deformation, for example).

This deformation leads to the changes in distance between each of the movable mirrors 760 and 761 mounted on the stage 660 and the photosensitized substrate W held on the table 660, resulting in errors in the measured values produced by respective interferometer units 800 and 801 serving to measure the positions of the movable mirrors 760 and 761. Further, the errors cause offsets between the estimated position for a pattern printing on the substrate W as estimated from the measured positions of the X-stage 621 and the Y-stage and the actual position for the pattern printing, these offsets may affect the accuracy in alignment between the reticle (not shown) and the photosensitized substrate W as well as the accuracy in positioning the exposure shot areas on the photosensitized substrate. The deformation of the table caused according to this mechanism is typically in the order of a few nanometers, which is enough to be a problem in recent exposure apparatus.

The forces tending to cause a minute deformation of the table such as described above may be created by inertial forces acting on the table due to acceleration/deceleration of the stage, or by the deformation of the plate spring which may occur, as a result of a focusing and/or levelling operation as described above. The former factor, the inertial forces, do not occur during the exposure operation following the completion of the positioning of the stage and thus do not directly lead to any deterioration in registration, while the latter factor, the deformation of the plate spring, may occur at any time, and further, may vary depending on the displacement of the table required for the focusing and/or levelling operation, so that it is highly probable that any deformation of the plate spring causes some deterioration in registration.

SUMMARY OF THE INVENTION

It is a first object of the present invention to provide a stage apparatus for movably mounting a table on a stage, in which any stress in the table and/or any thermal deformation of the table may be effectively reduced.

It is a second object of the present invention to provide a stage apparatus for movably mounting a table on a stage, in which any harmful deformation of the table, which could otherwise be occured when the table is driven for displacement in the Z-direction and/or for tilting, may be effectively minimized.

It is a third object of the present invention to provide an exposure apparatus having a stage apparatus for movably mounting a table on a stage, in which any stress in the table and/or any thermal deformation of the table may be effectively reduced.

It is a fourth object of the present invention to provide an exposure apparatus having a stage apparatus for movably mounting a table on a stage, in which any harmful deformation of the table, which could otherwise be occured when the table is driven for displacement in the Z-direction and/or for tilting, may be effectively minimized.

A stage apparatus according to the present invention, which is directed to the first object described above, for movably mounting a table on a stage, the stage apparatus comprising: a table; a support device for supporting the table at a center of gravity thereof; and a drive device for driving the table without contacting the table.

In this stage apparatus, the support device may comprise a drive mechanism for providing contact drive for the table in a vertical direction. Further, in such a case, the drive device may comprise a levelling unit for providing support for the table at two points apart from the center of gravity of the table and for adjusting tilt of the table with respect to the stage.

Alternatively, the drive device may be so constructed as to support the table while being free of contact with the table at three points apart from the center of gravity and to drive the table in a vertical direction and in directions for tilt adjustment of the table with respect to the stage, and the support device may be so constructed as to support the table without contact by imposing thereon constraint forces which are sufficiently weak so as to not to interfere with driving of the table effected by the drive device. In such a case, the support device may comprise a mechanism utilizing magnetic repulsive forces.

With the stage apparatus directed to the first object described above, the table is supported by the support device at the center of gravity of the table, so that the drive device does not need to bear any of the weight of the table. Thus, where the drive device comprises drive mechanism of a contact free type, such a mechanism is not required to provide a great thrust force because the weight of the table is supported by the support device. As a result, any heat generated by the drive mechanism, such as a group of actuators, may be minimized so as to prevent thermal deformation of the table by heat.

Further, since the drive device need not be composed of a direct-contact drive mechanism, problems associated with a direct-contact drive mechanism, i.e., the stresses induced in the table due to frictional forces acting on the contact points between the table and the direct-contact actuators, may be avoided.

Where the drive device is so constructed as to support and drive the table at three points except for the support device, the total number of supported points of the table will be four, thus, a problem of a statically indeterminate supporting structure for the table occurs. However, the problem may be solved by constructing the support device so as to support the table with a constraint force acting on the table, which is weaker than that of the drive device at the three support points.

Several stage apparatus according to the present invention, that are directed to the second object described above, are devised in view of the fact that it is effective, for the purpose of reducing or eliminating any harmful deformation of the table, to minimize any forces acting on the table and/or to arrange the stage apparatus such that only those acting on the table in particular directions which will not cause any deformation of the table are allowed to occur. Thus, the stage apparatus directed to the second object is constructed as follows.

According to the first embodiment of the present invention which is directed to the second object described above, there is provided a stage apparatus, comprising: a stage movable along a reference plane; a table movable relative to the stage at least in a direction of a first axis perpendicular to the reference plane; three resilient members for constraining a position of the table relative to the stage; three drive pins for supporting the table at respective support points substantially just under respective securing points on the table at which the resilient members are secured to the table and for driving the table in the direction of the first axis at the respective support points; and a drive system for driving the drive pins simultaneously or independently.

With this stage apparatus, the table is not only movable along the reference plane for one-dimensional (or two-dimensional) motion together with the stage but is also movable relative to the stage at least in the direction of the first axis. As a result, the table is movable with at least two degrees of freedom. For example, if the drive pins are driven simultaneously by the drive system, then translational motion of the table is caused in the direction of the first axis. During this translational motion, the drive pins support for the table at support points substantially just under respective securing points on the table at which the resilient members are secured to the table, as well as driving the table in the direction of the first axis at the respective support points. Any forces acting on the table in the direction of the first axis will create only compressions and no moment, whereby deformation of the table is minimized. This also applies to the case where the drive pins are independently driven by the drive system to cause different displacements at the respective support points so as to provide tilting of the table.

According to the second embodiment of the present invention which is directed to the second object described above, there is provided a stage apparatus, comprising: a stage movable along a reference plane; a table movable relative to the stage at least in a direction of a first axis perpendicular to the reference plane; three drive pins for supporting the table at three different support points and for driving the table in the direction of the first axis at the three support points; three resilient members, disposed at respective three positions around a circle within which a center of gravity of the table lies, for providing constraint forces against motions of the table relative to the stage, wherein the constraint forces are strong against motions of the table relative to the stage in directions parallel to the reference plane, while the constraint forces are weak in the other directions; and a drive system for driving the drive pins simultaneously or independently.

With the stage apparatus according to the second embodiment, as with the first embodiment, the table is movable with at least two degrees of freedom. For example, if the drive pins are driven simultaneously by the drive system, translational motion of the table is caused in the direction of the first axis. Since three resilient members, which constrain the position of the table relative to the stage, are disposed at respective three positions around a circle within which the center of gravity of the table lies to thereby provide constraining forces which act strongly against motions of the table relative to the stage in directions parallel to the reference plane, while being weak in the other direction, the resistance against this translational motion of the table in the direction of the first axis is weak. Further, since the table has high rigidity, deformation of the table may be minimized when forces act on the table in directions along a plane of the table. This also applies to a case in which the drive pins are independently driven by the drive system for different displacements at the respective support points so as to tilt the table.

According to a third embodiment of the present invention which is directed to the second object described above, there is provided a stage apparatus having an arrangement similar to that of the first and second embodiments, wherein: each resilient member is a plate spring having a high rigidity in one of three orthogonal directions and low rigidities in the other two directions, the plate spring being disposed such that a radial direction from a point of the center of gravity of the table is coincident with the one direction of the high rigidity. By virtue of this, a uniform, high rigidity distribution in all the directions parallel to a plane of the table may be obtained.

According to a fourth embodiment of the present invention which is directed to the second object described above, there is provided a stage apparatus having an arrangement similar to that of the first, second and third embodiments, wherein: each resilient member is a plate spring which is subject to pantagraph-like deformation when the table is displaced or loaded with a load in the direction of the first axis, the pantagraph-like deformation of the plate spring provides a low rigidity in the direction of the first axis. With this arrangement, because each resilient member is a plate spring which is subject to pantagraph-like deformation when the table is displaced or loaded with a load in the direction of the first axis, and the pantagraph-like deformation of the plate spring provides a low rigidity in the direction of the first axis, any reaction forces acting on the table from the plate springs when the table is driven in the direction of the first axis may be reduced and thereby deformation of the table may be further reduced.

An exposure apparatus according to the present invention, which is directed to the third object described above, has a stage apparatus for movably mounting a table on a stage, the table being adapted to hold thereon a photosensitized substrate onto which a pattern formed on a mask is transferred by exposure, wherein the stage apparatus comprises: a table; a support device for supporting the table at a center of gravity thereof; and a drive device for driving the table without contacting the table.

An exposure apparatus according to the present invention, which is directed to the fourth object described above, has a stage apparatus including a stage movable along a reference plane, the stage being adapted for carrying a table for movement thereon, the table being adapted to hold thereon a photosensitized substrate onto which a pattern formed on a mask is transferred by exposure, wherein the stage apparatus comprises: a table movable relative to the stage at least in a direction of a first axis perpendicular to the reference plane; three resilient members for constraining a position of the table relative to the stage; three drive pins for supporting the table at respective support points substantially just under respective securing points on the table at which the resilient members are secured to the table and for driving the table in the direction of the first axis at the respective support points; and a drive system for driving the drive pins simultaneously or independently.

DESCRIPTION OF THE PREFERRED EMBODIMENTS

Referring now to the accompanying drawings, the present invention is described with reference to several preferred embodiments thereof. Each embodiment shows an exemplified application of the present invention to a wafer stage used with an exposure apparatus for use in a fabrication process for semiconductor devices.

Figure 1:
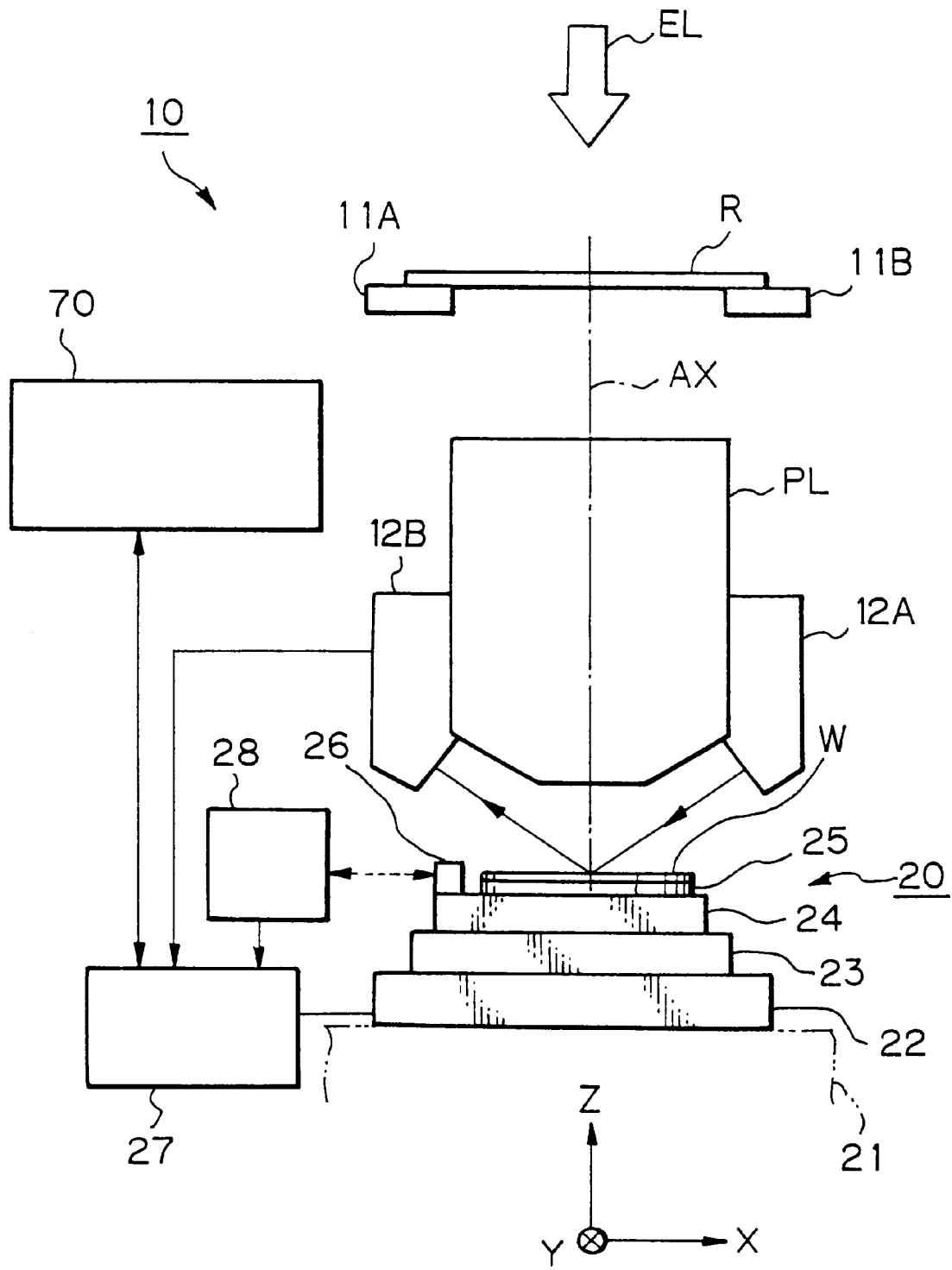
FIG. 1 is a schematic representation of an exposure apparatus in which a stage apparatus according to an embodiment of the present invention may be used.

FIG. 1 is a schematic representation of a projection exposure apparatus 10 in which an stage apparatus according to any of embodiments of the present invention may be used.

The projection exposure apparatus 10 has a stage apparatus 20 which provides motions or displacements of the photosensitized substrate or wafer W mounted thereon, with five degrees of freedom. That is, the motion or displacement of the wafer W may have components including translational motion in three directions along X-, Y- and Z-axes and rotations about the X- and Y-axes. The projection exposure apparatus 10 further comprises a projection lens PL disposed above the stage apparatus 20 and having its optical axis AX oriented parallel to the Z-axis, and a reticle holder (composed of two parts 11a and 11b) for holding thereon a reticle R such that the reticle R is located above the projection lens PL and is so oriented as to extend in a plane perpendicular to the optical axis AX of the projection lens PL. In FIG. 1, the X-direction is defined as the horizontal direction parallel to the paper surface of the drawing sheet, the Y-direction as the direction perpendicular to the paper surface of the drawing sheet and the Z-direction as the vertical direction in the drawing.

The stage apparatus 20 comprises a base 21, a Y-stage 22 mounted on the base 21 and capable of movement in the Y-direction, a X-stage 23 mounted on the Y-stage 22 and capable of movement in the X-direction, a table 24 supported on the X-stage 23 and capable of movement or displacement in the Z-direction and tilting with respect to a XY-plane, and a wafer holder 25 mounted on the table 24. The wafer holder 25 carries a photoresist-coated wafer W thereon, which is secured onto the wafer holder 25 through a vacuum-chuck (not shown).

The reticle holder (11a, 11b) is capable of minute two-dimensional displacements in the X- and Y-directions, through which a reticle alignment operation may be performed so as to align a center of a "pattern bearing surface" of a reticle R (or a "reticle center") with the optical axis AX. Further, in this embodiment, the reticle holder (11a, 11b) is capable of rotational or angular displacement about the optical axis AX, through which a rotational alignment between the wafer W and the reticle R may be achieved during the reticle alignment operation.

In FIG. 1, with an exposure light beam EL (represented by an outline arrow) illuminating the reticle R, the pattern formed on the reticle R is projected through the projection lens PL onto the wafer W for exposure, for which the surface of the wafer W in the exposure field needs to be coincident with the image plane defined by the projection lens PL (i.e., the image plane of the projected pattern) in order to form a high-quality image of the pattern on the wafer W. For this purpose, the exposure apparatus shown is provided with a focusing/levelling sensor system comprising a light-transmitting unit 12a and a light-receiving unit 12b disposed on opposite sides of the projection lens PL. The focusing/levelling sensor system is a so-called multipoint auto-focusing (AF) system of the oblique-incidence type, which is capable of detecting a Z-position of a surface of the wafer W (or a defocusing amount of the wafer w) and a tilt of the surface of the wafer W with respect to a XY-plane.

There is provided a stage control system 27. In advance to the exposure operation to an exposure field, the stage control system 27 monitors an output signal from the light-receiving unit 12b so as to examine whether the image plane of the projected pattern and the surface of the wafer W in the exposure field are coincident with each other, and controls, if necessary, drive units (described later) for driving the table 24 so as to displace the surface of the wafer W in the exposure field into a desired position where it is coincident with the image plane of the projected pattern. In this manner, control of the focusing/levelling operation is performed in this embodiment.

Figure 2:
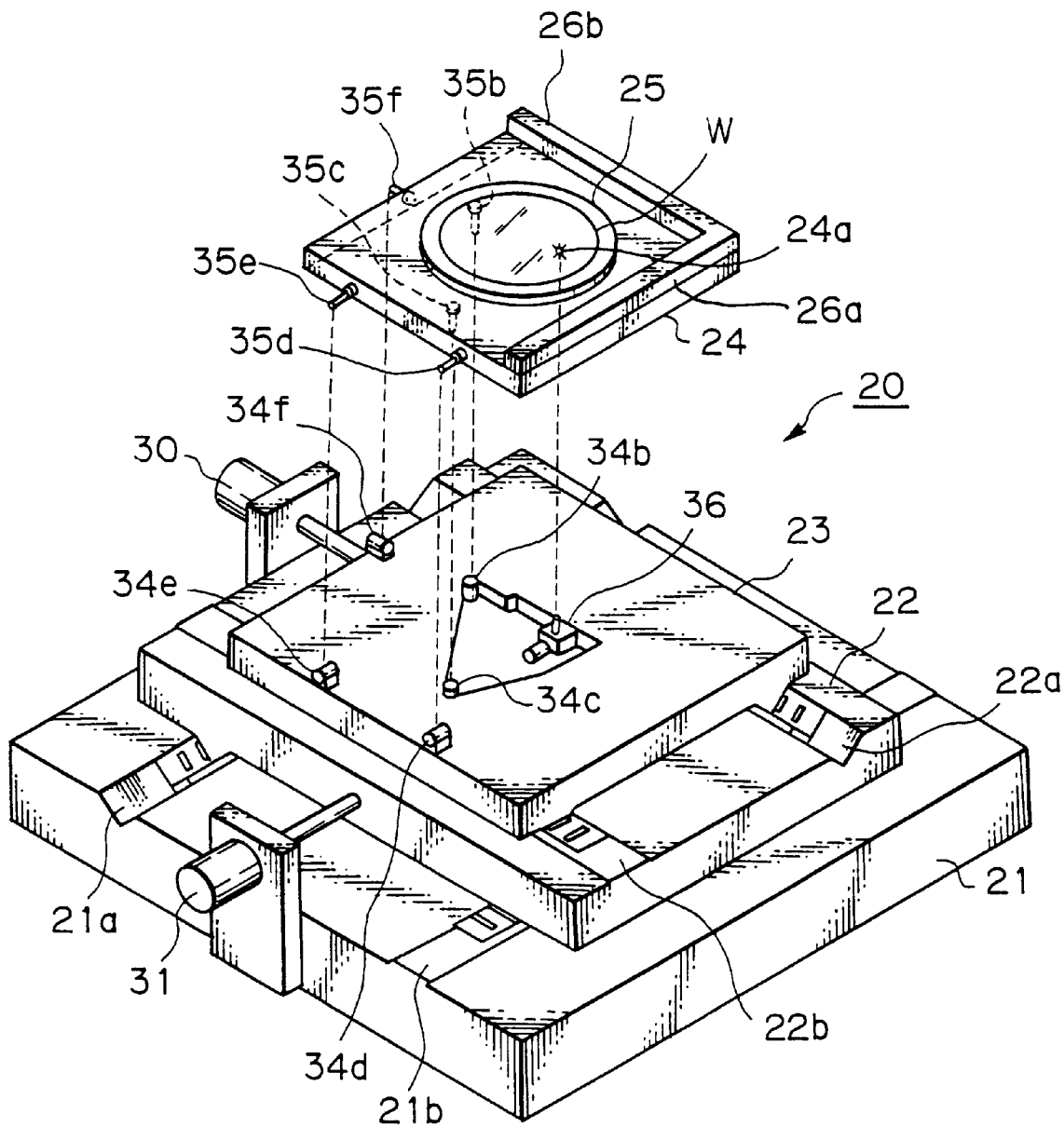
FIG. 2 is a perspective view of a stage apparatus according to a first embodiment of the present invention, which may be used in the exposure apparatus of FIG. 1.

The table 24 has a movable mirror 26 fixedly mounted thereon, a position of which is measured by a laser interferometer unit 28. Actually, as shown in FIG. 2, the table 24 has a X-direction movable mirror 26a and a Y-direction movable mirror 26b mounted thereon, and there are provided a X-axis laser interferometer unit 28a and a Y-axis laser interferometer unit 28b (see FIG. 7) associated with the movable mirrors 26a and 26b, respectively. However, in FIG. 1, the movable mirrors 26a and 26b are represented by the single movable mirror 26 and the laser interferometer units 28a and 28b are represented by the single interferometer unit 28. Accordingly, the laser interferometer unit 28 measures a two-dimensional position of the table 24 (and thus of the wafer W), through which positions of the X-stage 23 and the Y-stage 22 are measured. The measured values are input to the stage control system 27. The stage control system controls motions of the X-stage 23 and the Y-stage 22 through a X-drive motor 30 and a Y-drive motor 31 (these drive motors are not shown in FIG. 1; see FIGS. 2 and 3, respectively), while monitoring the measured values supplied by the interferometer unit 28.

All of the drive/control operations for the stage apparatus, including those for the focusing control and the levelling control, as well as any other operations for the exposure, are under the control of the control apparatus 70.

FIG. 2 shows the stage apparatus 20 according to the first embodiment of the invention. As described above, the stage apparatus 20 comprises the table 24 which is capable of minute motion with six degrees of freedom and which holds a wafer W thereon through the wafer holder 25. The stage apparatus 20 further comprises the X-stage 23 capable of a coarse positioning of the table 24 in the X-direction, the Y-stage 22 capable of a coarse positioning of the table 24 in the Y-direction and the base 21 supporting the Y-stage 22 for sliding motion. Also, as described above, the table 24 has the X-direction movable mirror 26a and the Y-direction movable mirror 26b mounted thereon along two of the four side edges of the table 24. Since the X-direction movable mirror 26a and the Y-direction movable mirror 26b serves as a reference for a position measurement of the wafer W, any displacements of the movable mirrors relative to the wafer W, which may be caused by a deformation of the table 24, would greatly affect an accuracy in alignment of the wafer W which is being exposed.

The base 21 has two Y-stage guide rails 21a and 21b provided thereon along which the Y-stage 22 moves. That is, the Y-stage 22 is moved on the base 21 along these Y-stage guide rails 21a and 21b by a Y-stage drive unit 31. The Y-stage 22 has two X-stage guide rails 22a and 22b provided thereon for guiding the X-stage 23. The X-stage 23 is moved on the Y-stage 22 along these X-stage guide rails 22a and 22b by a X-stage drive unit 30.

The X-stage 23 has coils 34d, 34e and 34f of an actuator of a contact free type such as a voice coil motor (VCM), which are mounted on the top surface of the X-stage 23. The table 24 has three magnets 35d, 35e and 35f mounted on side surfaces thereof at positions corresponding to the coils 34d, 34e and 34f. These coils 34d, 34e and 34f, and magnets 35d, 35e and 35f together form three actuators of the moving-magnet (MM) type. These three actuators (34d, 35d; 34e, 35e; 34f, 35f) are used to drive the table 24 for displacement in a XY-plane. VCM actuators falls into two categories: moving-magnet (MM) actuators and moving-coil (MC) actuators. Although both types of actuators may be used for this purpose, MM -actuators are preferable because of the smaller amount of heat transferred to the table 24 from the actuators.

The X-stage 23 has a recess formed therein at a central portion of its top surface, which recess has a generally triangular shape. Additional two coils 34b and 34c of actuators of a contact free type are disposed at two of the three corners of the triangular recess. The table has additional two magnets 35b and 35c mounted on a bottom surface thereof at positions corresponding to the coils 34b and 34c. These coils 34b and 34c and the magnets 35b and 35c together form two actuators. These two actuators (34b, 35b; 34c, 35c) are used to drive the table 24 so as to adjust its tilt with respect to the X-stage 23 (i.e., to perform the levelling of the table 24). Further, the X-stage 23 has a direct-contact actuator 36 mounted thereon at a position in the triangular recess that corresponds to the center of gravity of the table 24. The direct-contact actuator 36 is used to bear the weight of the table 24 at a single point.

Figure 3:
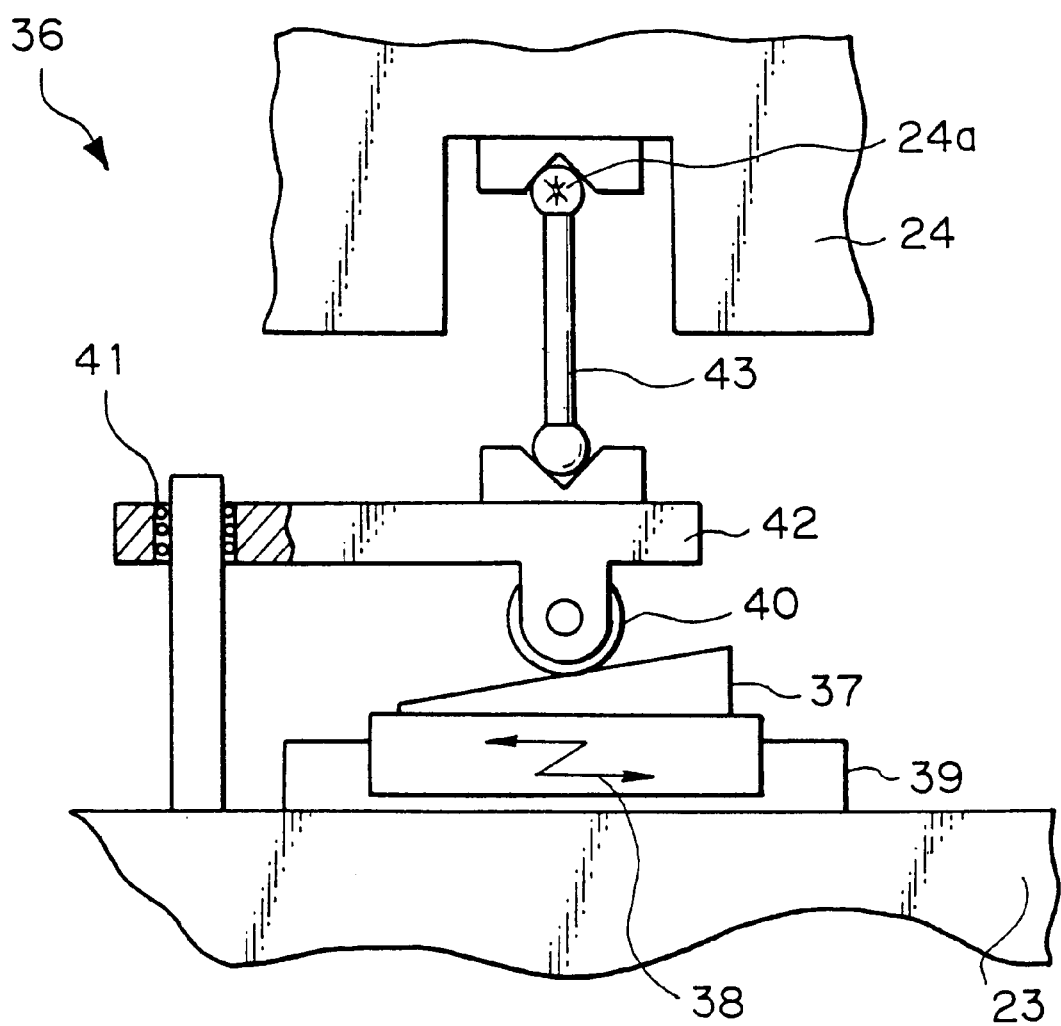
FIG. 3 is an enlarged side elevation, partially cut away, of a critical portion of the first embodiment.

FIG. 3 shows the direct-contact actuator 36 in more detail. As shown, a cam 37 fixedly mounted on a slider 38 is guided by a linear guide 39 for motion along the linear guide 39. A linear-motion table 42 is guided by a linear guide 41 for motion in the Z-direction. A follower roller 40 is attached to the linear-motion table 42 through a radial bearing and is in contact with the cam 37. With this arrangement, any motion of the cam 37 along the linear guide 39 causes a motion of the linear-motion table 40 along the linear guide 41 and thus in the Z-direction. Further, a link mechanism 43 is provided between the linear-motion table 42 and the table 24 for transmitting a driving force from the linear-motion table 42 to the table 24. By virtue of this, the table 24 is driven at a point 24a of its center of gravity, by the direct-contact actuator 36, in the vertical direction (or the Z-direction).

With the stage apparatus according to the first embodiment of the present invention shown in FIGS. 2 and 3, in order to achieve alignment of the wafer W, the alignment optical system shown in FIG. 1 is used to determine the position (or deviation) of the wafer W, and then the X-stage 23 and the Y-stage 22 are driven depending on the determined position of the wafer W so as to perform a coarse positioning of the wafer W. Then, the three actuators of the contact free type (34e, 35d; 34e, 35e; 34f, 35f) on the X-stage 23 are used to correct for any offset (or translational misalignment) and rotational misalignment of the table 24 in a XY-plane. In addition, the direct-contact actuator 36 is used to correct the vertical (Z-direction) position of the table 24 and the two actuators of the contact free type (34b, 35b; 34c, 35c) are used to correct a tilt (or perform the levelling) of the table 24. It is noted that when the table 24 is not moving in the Z-direction, almost all the weight of the table 24 is borne by the direct contact actuator 36, whereby the thrust forces acting on the table 24 from the two actuators of the contact free type (34b, 35b; 34c, 35c) are very small.

Figure 4:
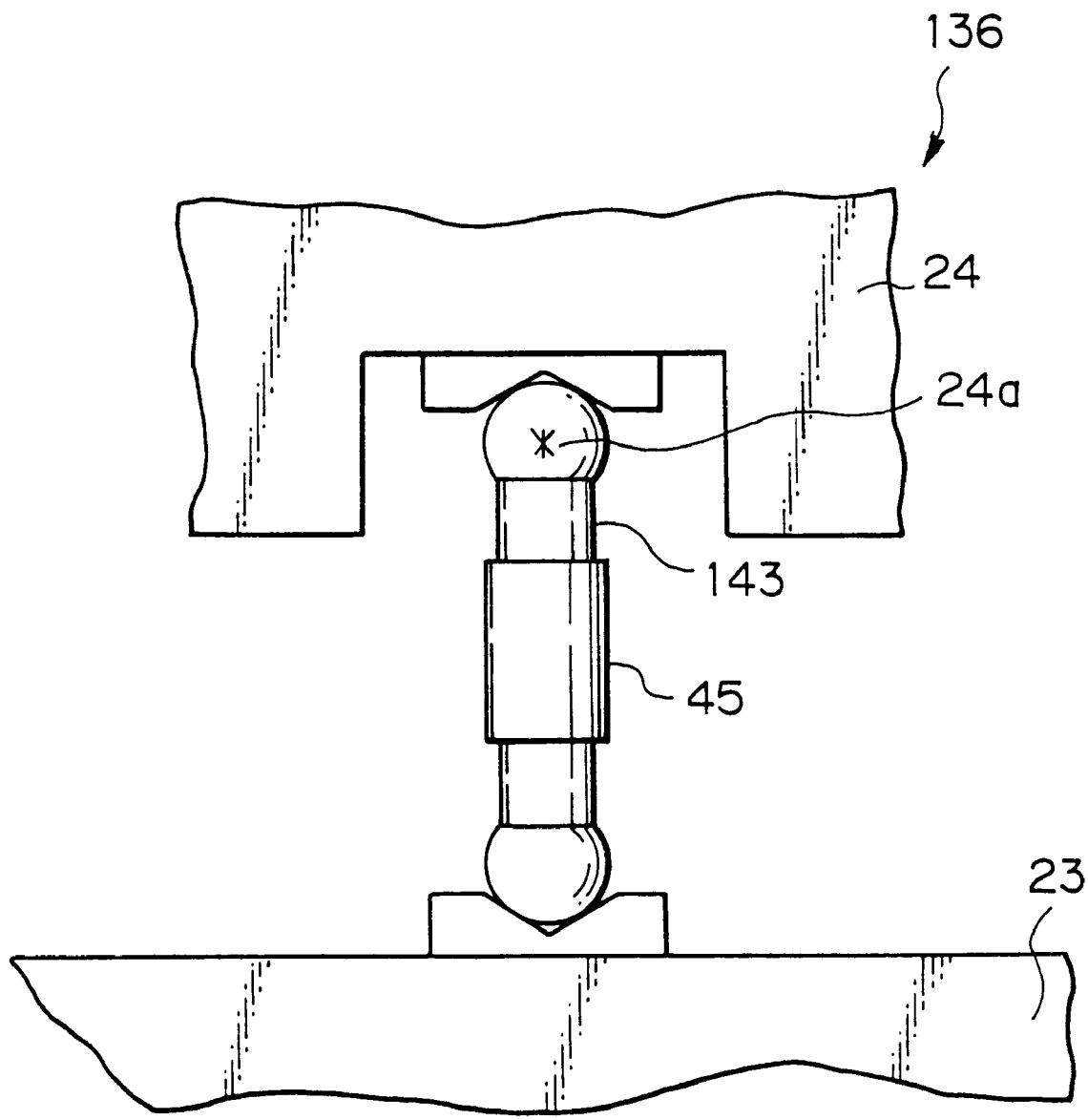
FIG. 4 is an enlarged side elevation, partially cut away, of a critical portion of a stage apparatus according to a second embodiment of the present invention.

FIG. 4 shows a direct-contact actuator 136 used in a stage apparatus according to a second embodiment of the present invention. The actuator 136 may be used instead of the actuator 36 shown in FIG. 3. In FIG. 4, similar elements are designated by the same reference numerals as used in FIG. 3. The actuator 136 used in the second embodiment comprises a link mechanism 143 which is provided between the X-stage 23 and the table 24 in order to connect them each other. The link mechanism 143 has a piezoelectric element 45 at a middle portion thereof for driving the table 24 in a vertical direction. In this manner, a vertical position of the table 24 is adjusted at the point 24a of its center of gravity.

Figure 5:
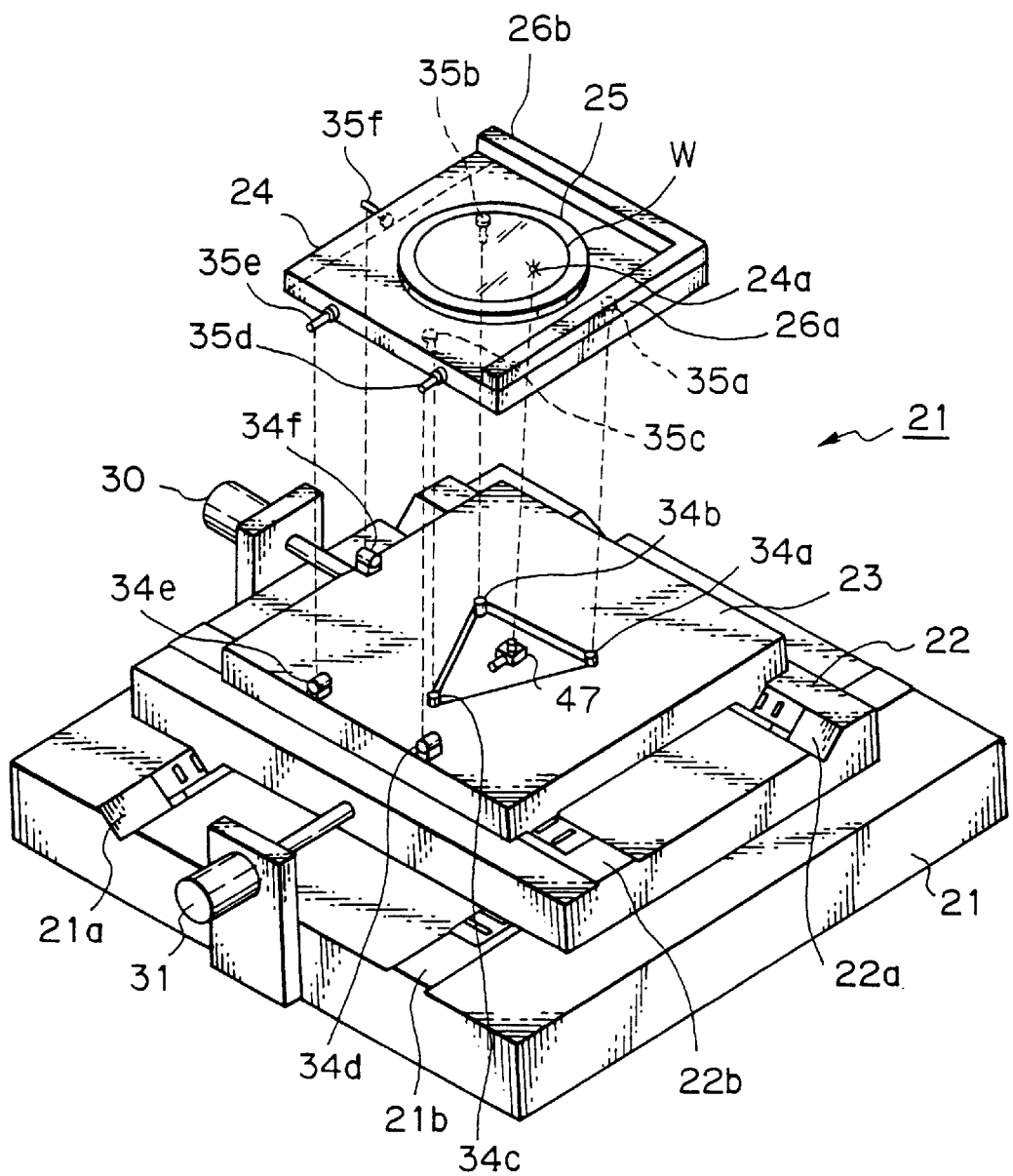
FIG. 5 is a perspective view of a stage apparatus according to a third embodiment of the present invention.
Figure 5:
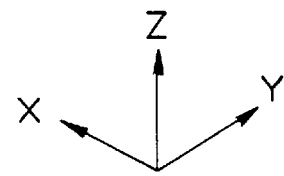

FIG. 5 shows a stage apparatus according to a third embodiment of the present invention. The stage apparatus of the third embodiment has the same arrangement as the first embodiment shown in FIGS. 1 and 2 except for the mechanism for driving the table 24 in the vertical direction. In FIG. 5, similar elements are designated by the same reference numerals as used for the elements of the stage apparatus of FIG. 2 and will not be described for their structures and operations in detail. The embodiment of FIG. 5 comprises a magnetic table weight bearing mechanism 47 just under the point 24a of the center of gravity of the table 24 for bearing almost all the weight of the table 24 at the point 24a. Further, the X-stage 23 has three coils 34a, 34b and 34c of actuators of a contact free type, which are mounted thereon at positions which define three corner points of a triangle within which the point 24a of the center of gravity of the table 24 lies. Three magnets 35a, 35b and 35c are mounted the table 24 and received by the coils 34a, 34b and 34c, respectively. These coils 34a, 34b and 34c and magnets 35a, 35b and 35c together form three noncontact actuators. The table weight bearing mechanism 47 is a supporting structure with constraint forces which are sufficiently weak so as to not to interfere with driving of the table in three directions along the X-, Y- and Z-axes. Thus, the driving of the table in three directions along the X-, Y- or Z-axes, or the rotating of the table about the X-, Y- or Z-axes is carried out by six pairs of the actuators of the contact free type (34a, 35a; 34b, 35b; 34c, 35c; 34d, 35d; 34e, 35e; 34f, 35f) exclusively.

Figure 6:
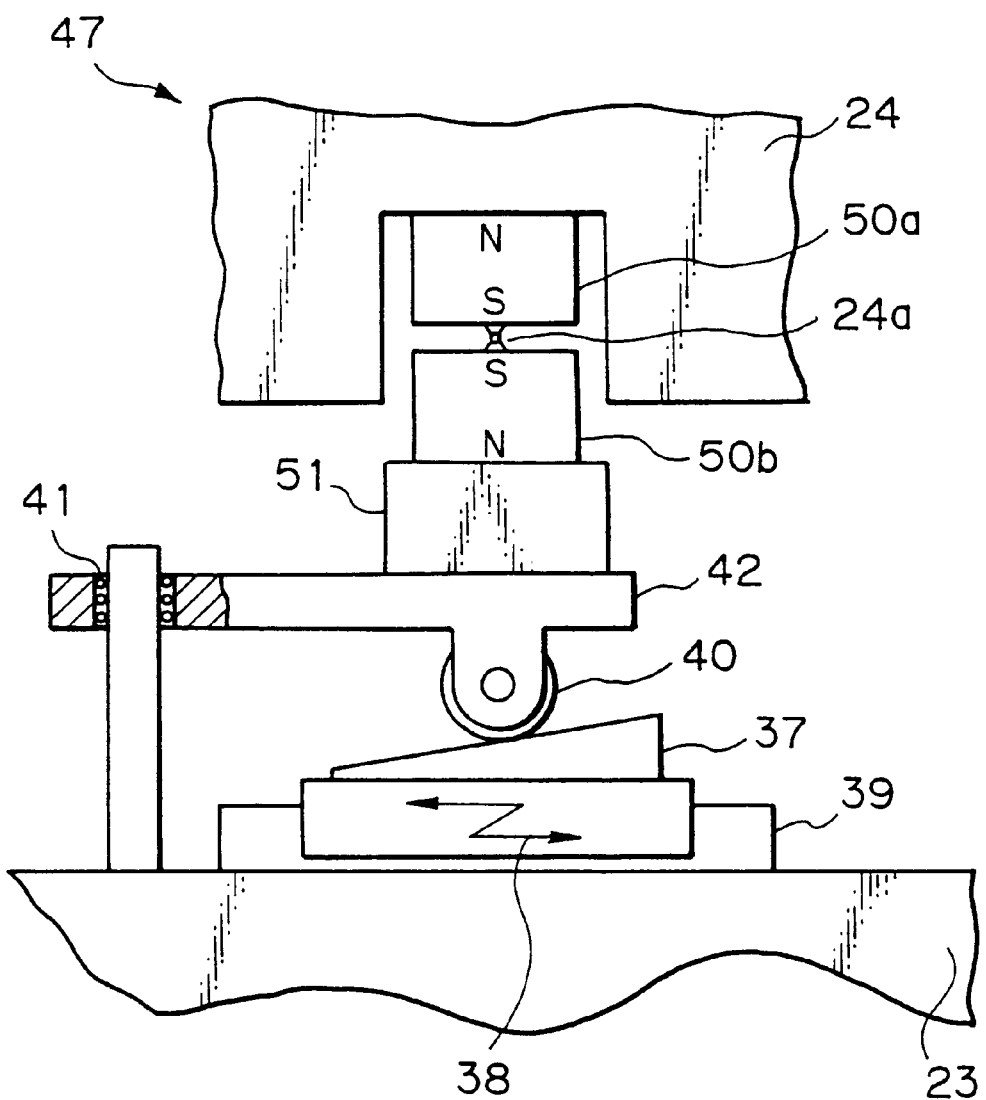
FIG. 6 is an enlarged side elevation, partially cut away, of a critical portion of the third embodiment.

FIG. 6 shows the table weight bearing mechanism 47 in more detail. In FIG. 6, similer elements are designated by the same reference numerals as use in FIG. 3 and will not be described in detail so as to avoid repetition. The table weight bearing mechanism 47 comprises a pair of permanent magnets 50a and 50b for magnetically interconnecting the table 24 and the X-stage 23 with each other. The permanent magnets 50a and 50b are so oriented as to produce a repulsive force between them. One permanent magnet 50a is mounted on the table 24 while the other permanent magnet 50b is secured to the linear-motion table 41 through a load cell 51 interposed between them.

With this arrangement, when the table 24 is displaced in the Z-direction by the actuators of the contact free type (34a, 35a; 34b, 35b; 34c, 35c), the gap between the permanent magnets 50a and 50b will change, resulting in a change in the repulsive force acting between them. Any change in the repulsive force is detected by the load cell 51. Then, the linear-motion table 24 is driven for a vertical displacement such that the repulsive force as detected by the load cell 51 may become equal to the weight of the table 24. By virtue of this, it is ensured that the weight of the table 24 is borne by the table weight bearing mechanism 47. Unlike the first embodiment described above, the three actuators of the contact free type (34a, 35a; 34b, 35b; 34c, 35c) are used not only for a levelling of the table 24 but also for a driving the table 24 in the vertical direction. Thus, the table weight supporting mechanism 47 is not involved in the alignment of the position of the table 24, but only serves, basically, to bear the table 24 at its center of gravity with almost no restraint force acting on the table 24.

Figure 7:
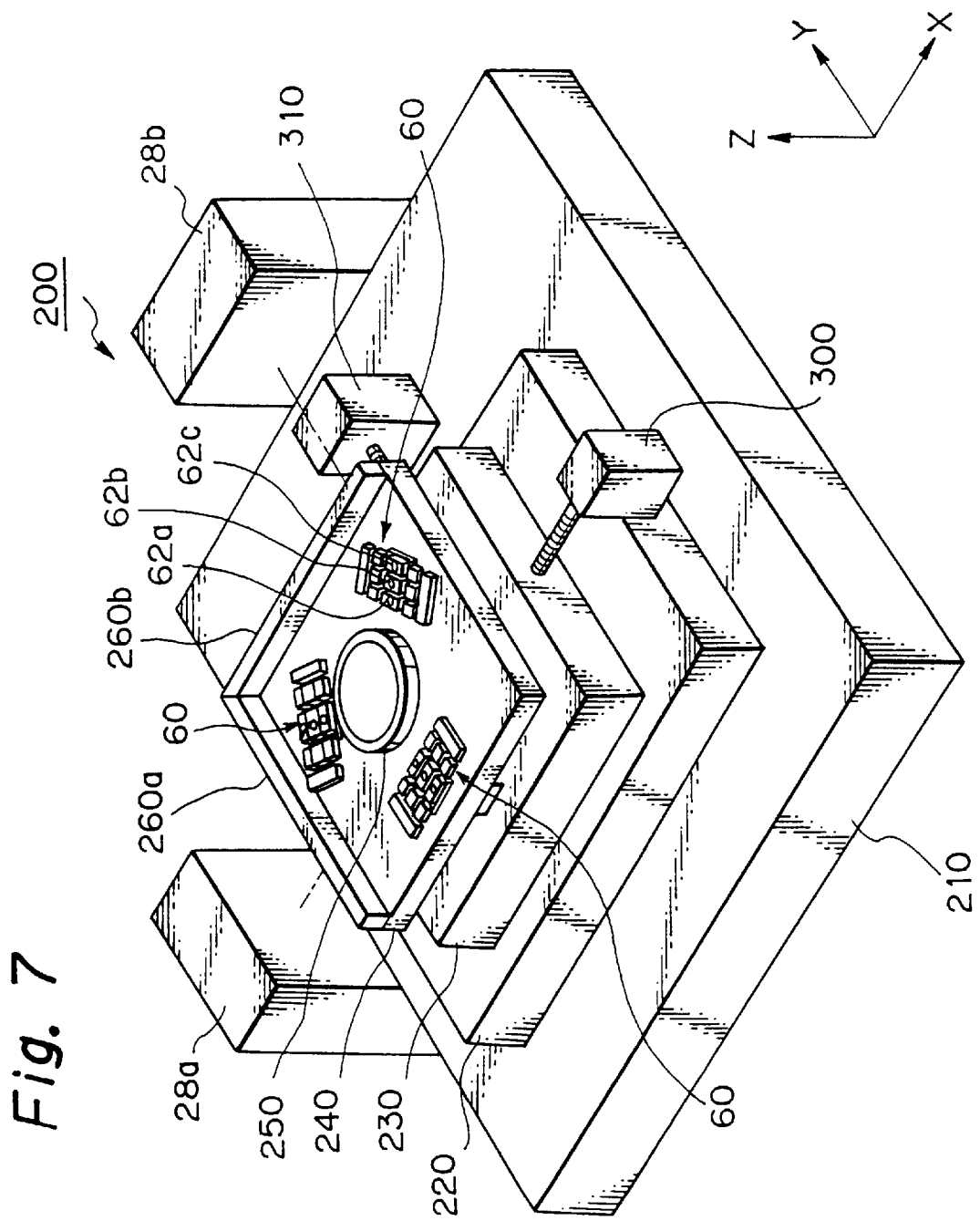
FIG. 7 is a perspective view of a stage apparatus according to a fourth embodiment of the present invention, which may be used in the exposure apparatus of FIG. 1.
Figure 8:
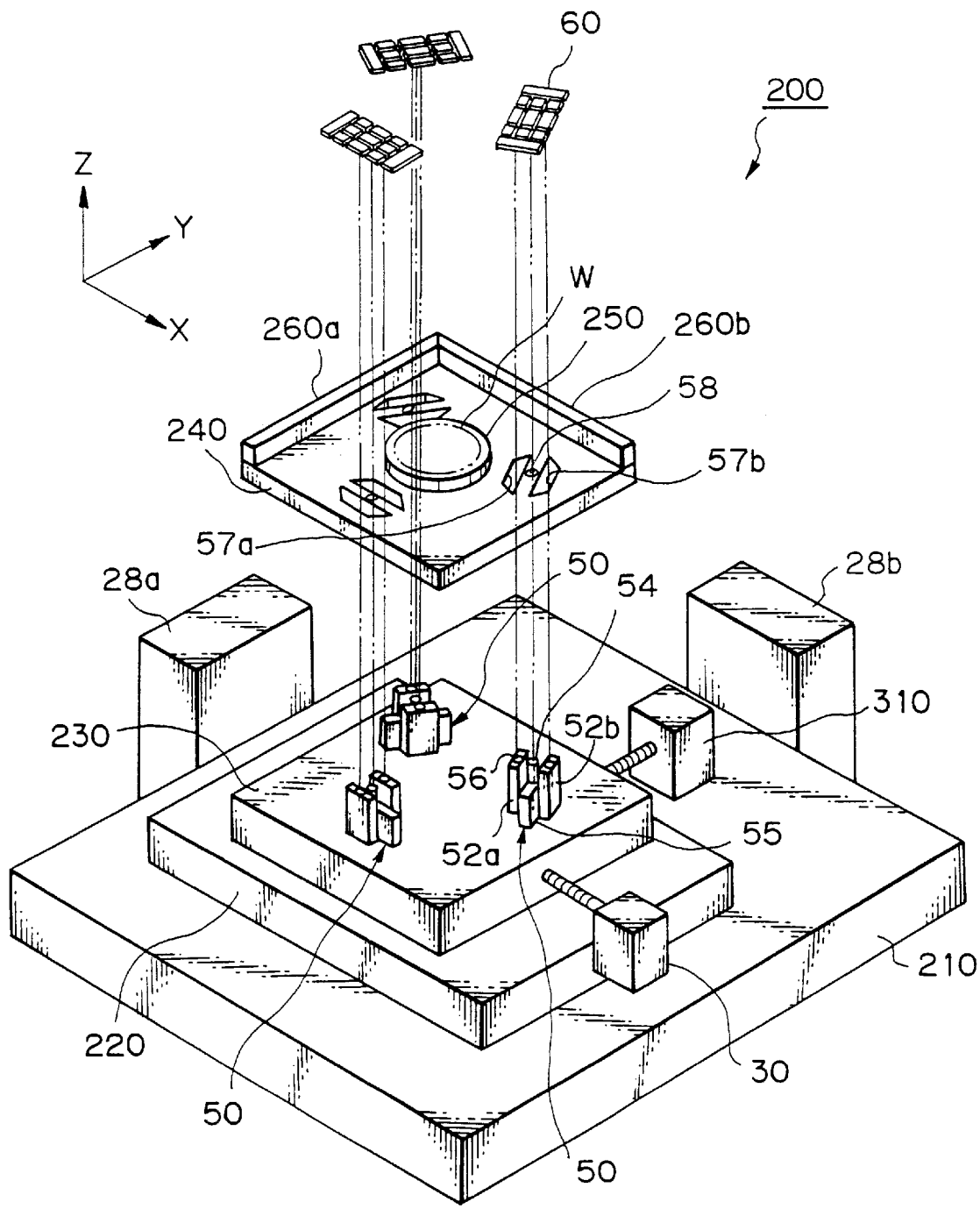
FIG. 8 is an exploded perspective view of the stage apparatus of FIG. 7.

FIG. 7 is a schematic perspective view of a stage apparatus 200 according to a fourth embodiment of the present invention and FIG. 8 is an exploded perspective view of the stage apparatus 200.

As shown in FIG. 8, a base 210 mounts thereon a Y-stage 220 which is driven in the longitudinal direction of the base 210 (or in the Y-direction) by a drive motor 310. The Y-stage 220 mounts thereon an X-stage 230 which is driven in the X-direction by another drive motor 300. Further, the X-stage 230 has three table support/drive assemblies 50 mounted thereon at positions defining the three corner points of a regular triangle. Each table support/drive assembly 50 comprises three pairs of table support bars 52a and 52b having a rectangular cross-section. The three pairs of table support bars 52a and 52b are disposed around a circle at regular angular intervals. The center of the circle is substantially coincident with the center of gravity of the X-stage 230. Each table support/drive assembly 50 further comprises a drive unit 55 having a drive pin 54 and disposed between the corresponding pair of table support bars 52a and 52b. Each of the table support bars 52a and 52b has a top end surface facing the table 240 and a screw hole 56 formed in the top end surface.

The table 240 has three pairs of trapezoidal openings 57a and 57b at positions facing the associated pair of table support bars 52a and 52b. The table 240 also has a screw hole 58 at positions between each pair of trapezoidal openings 57a and 57b. In order to attach the table 240 to the X-stage 230, the three pairs of table support bars 52a and 52b are inserted into the three pairs of trapezoidal openings 57a and 57b, respectively, and each pair of table support bars 52a and 52b are connected with the table 240 by a flexure 60 which is comprised of generally rectangular plate spring.

Figure 9A:
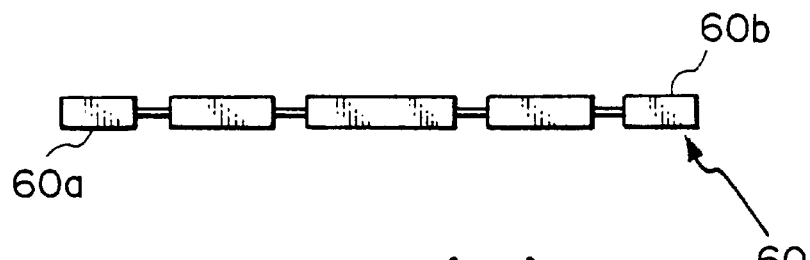
FIGS. 9A and 9B are a frontal view and a plan view, respectively, of a flexure used in the stage apparatus of FIG. 7.
Figure 9B:
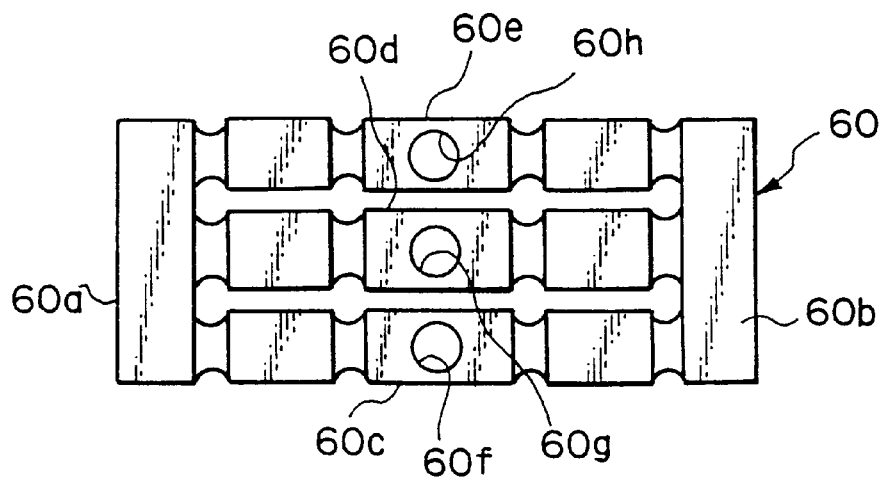

FIGS. 9A and 9B show an enlargement of the flexure 60, of which FIG. 9A is a frontal view and FIG. 9B is a plan view. The flexure 60 may be formed of a suitable stainless steel material (SUS), for example. As shown in FIG. 9A, the flexure 60 comprises a chain of alternate thicker and thinner portions, and has a symmetrical shape with respect to each of longitudinal and transverse center lines. All of the thicker and thinner portions except for the two thicker portions 60a and 60b at opposite ends of the flexure 60 are divided each into three portions. From another point of view, three parallel chains of thinner and thicker portions are connected with one another by the end thicker portions 60a and 60b. As shown in FIG. 9B, three thicker portions 60c, 60d and 60e arranged at the center position of each the three chains in the longitudinal direction of the flexure 60 have circular holes 60f, 60g and 60f, respectively, for receiving set screws 62a, 62b and 62c, respectively. The set screw 62b received in the circular hole 60g of the thicker portion 60d is in threading engagement with the screw hole 58 formed in the table 240, while the set screws 62a and 62c received in the remaining two circular holes 60f and 60h, respectively, are in threading engagement with the screw holes formed in the upper ends of the corresponding pair of table support bars 52a and 52b, respectively. In this manner, each the flexures 60 is secured to the table 240 and the pair of support bars 52a and 52b by three set screws. With this arrangement, the top surface of the table 240 is kept to coincident with the plane defined by the upper end surfaces of the table support bars 52a and 52b. In this manner, the table 240 is connected to the X-stage 230 through the three flexures 60 as shown in FIG. 7.

With the table 240 connected to the X-stage 230 as shown in FIG. 7, the table 240 is supported by the three drive pins 54 at respective positions each just under the central circular hole 60g of the associated flexure 60. The drive pins 54 are independently driven in the Z-direction by the associated drive units 55, whereby the table 240 is driven by the three drive pins 54 at three different points. As a result, the position in the Z-direction of the table 240 relative to the X-stage 230 and a tilt angles of the table 240 with respect to an XY-plane (i.e., the roll and pitch angles) may be set to any desired position and angles within limited ranges.

Figure 10:
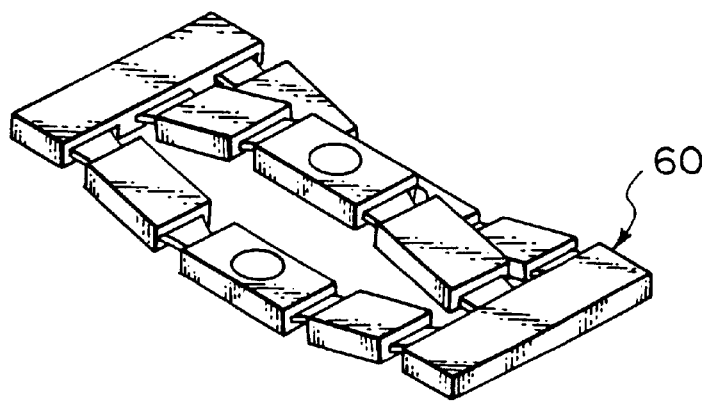
FIG. 10 is a perspective view of the flexure of FIGS. 9A and 9B when subject to a deformation.

In this embodiment, the three flexures 60 are used as resilient members for constraining the position of the table 240 relative to the X-stage 230. The flexures 60 are disposed around a circle, within which the center of gravity of the table 240 lies, at regular angular intervals. Further, each flexure 60 is oriented such that the high-rigidity direction (i.e., the direction perpendicular to the longitudinal direction) of the flexure 60 is coincident with a radial line from a point of the center of gravity of the table 240. By virtue of this, a uniform rigidity distribution in the horizontal directions (i.e., in the X- and Y-directions or in the r- and θ-directions (if the polar coordinates are used)) may be obtained. Further, each flexure 60 is subject to pantagraph-like deformation, as shown in FIG. 10, when loaded with a load or displaced in the Z-direction by the drive pins 54 during the focusing control operation or the levelling control operation. Any changes in the distance between one securing point on the table at which the flexure 60 is secured to the table 240 and the other securing points of the flexure 60 to the table support bars 52a or 52b (on the stage side) may be absorbed by the pantagraph-like deformation of the flexure 60, whereby any reaction forces acting on the table 240 from the flexures 60 may be reduced.

Moreover, each of the securing points on the table 240 at which the flexures 60 are secured to the table 240 and each of the driving points on the table 240 at which the drive pins 54 drive the table 240 during the focusing/levelling control operation (or, in other words, each of the support points on the table 240 at which the table 240 is supported by the drive pins 54) are vertically aligned with each other, whereby any forces acting on the table 240 in the Z-direction will create only compressions and no moment. Accordingly, any deformation of the table 240 may be minimized.

As can be understood from the above, with the embodiment described above, any reaction forces which may act on the table 240 due to the focusing/levelling operation (and which may produce a moment resulting in deformation of the table 240) may be effectively reduced. This in turn contributes to a reduction in any possible change in the distance between the wafer W and each of the movable mirrors 260a and 260, resulting in improvements in the registration as well as in the accuracy of the measured values of the coordinates of the exposure shot areas on the wafer W.

Figure 11:
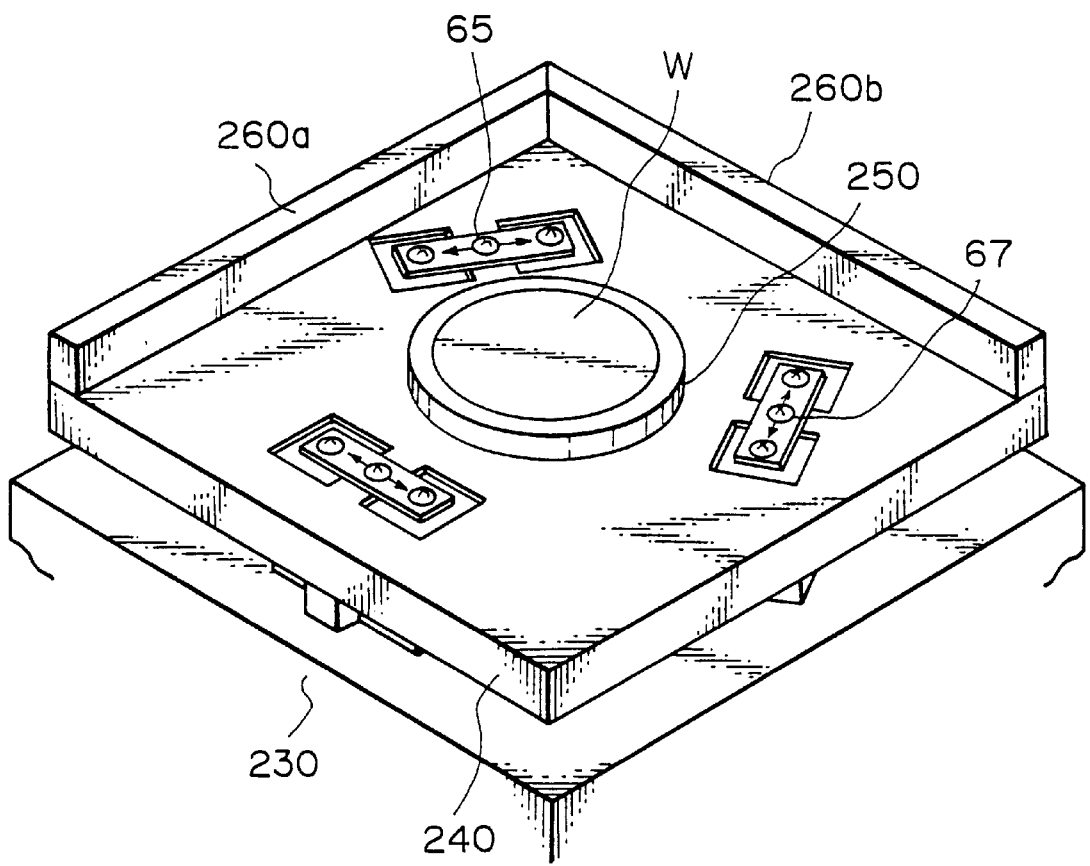
FIG. 11 is a perspective view of a modification to the stage apparatus of FIG. 7, showing a critical portion thereof.
Figure 12:
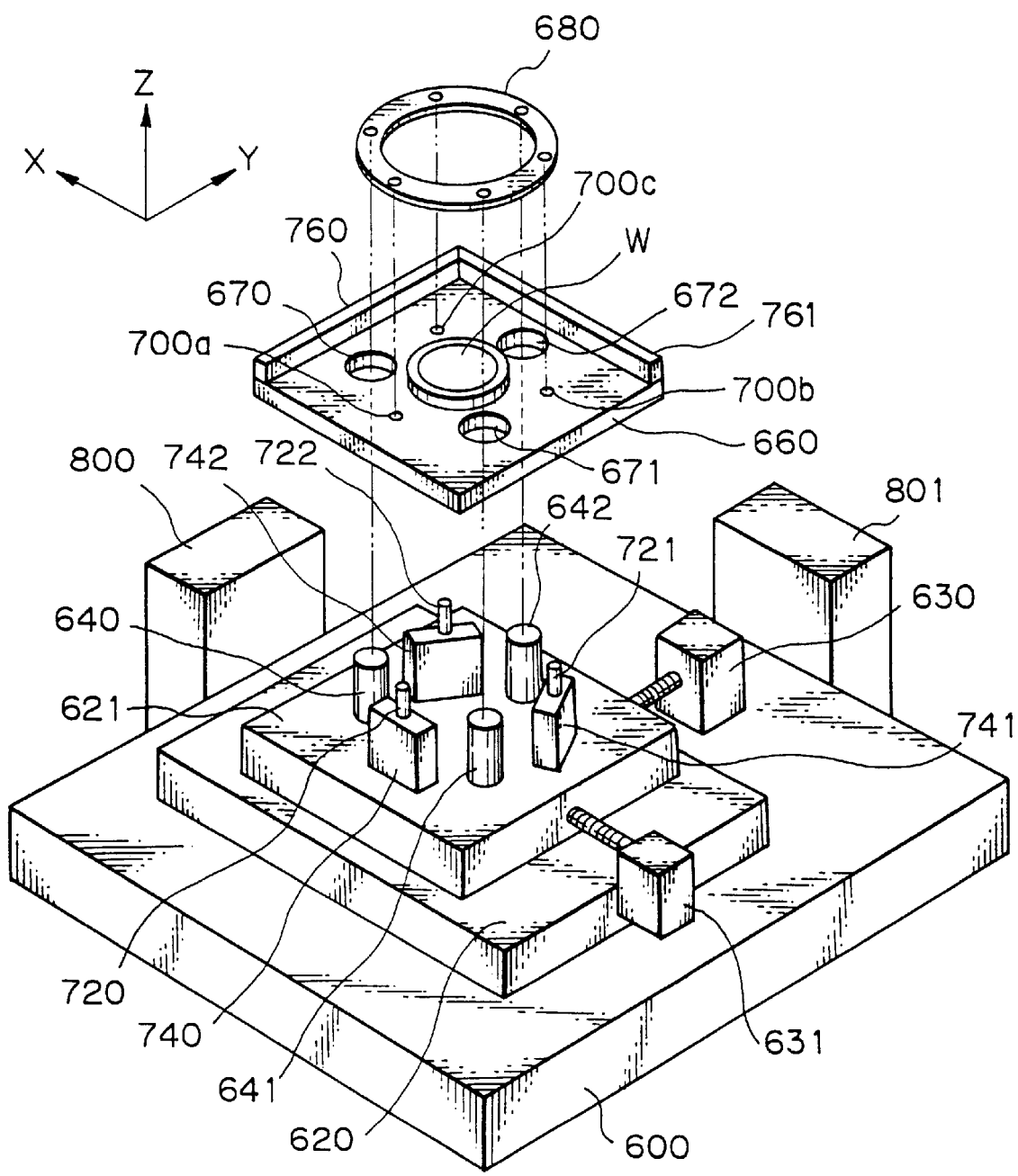
FIG. 12 is an exploded perspective view of a typical, conventional stage apparatus.
Figure 13:
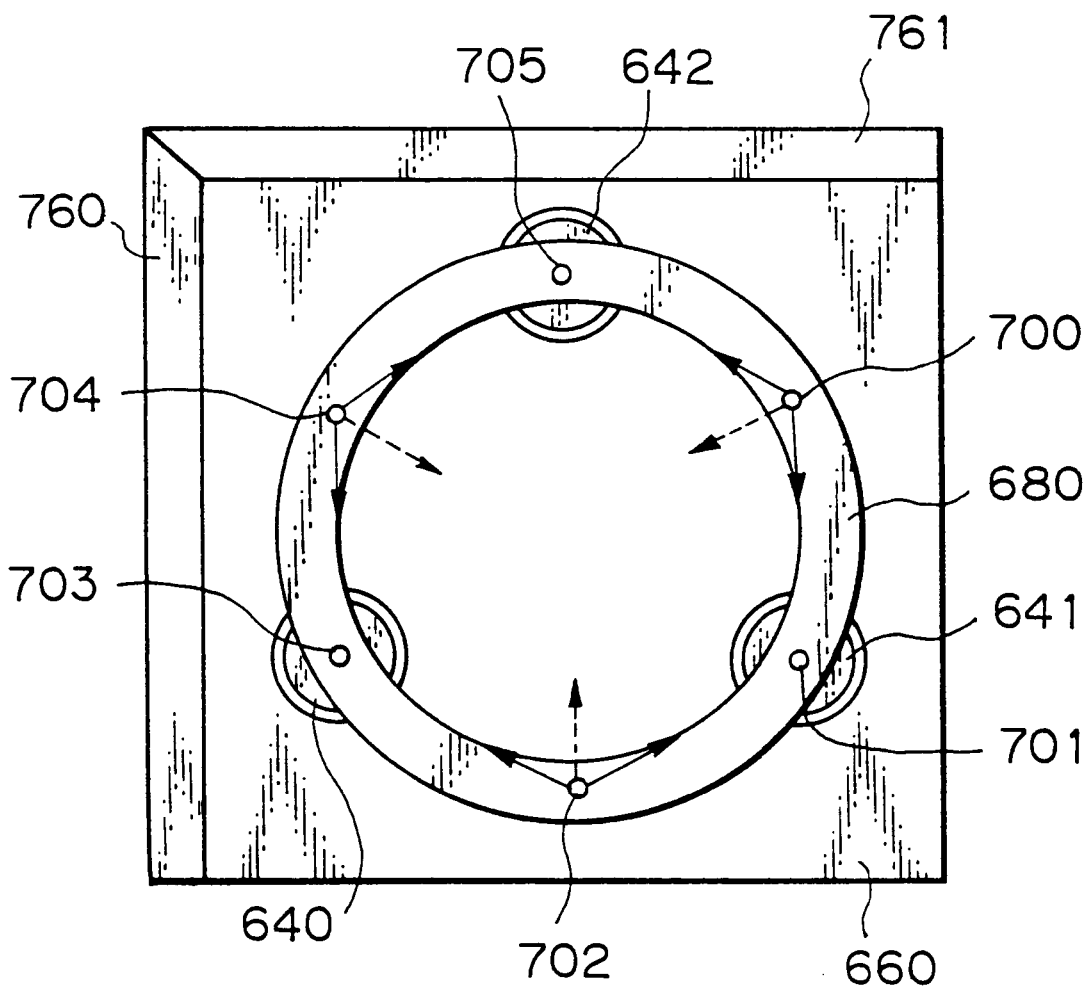
FIG. 13 is a schematic plan view of the stage apparatus of FIG. 12.

In the embodiment described above, the three flexures 60 are used as resilient members, and each flexure 60 is formed to be subject to pantagraph-like deformation when loaded with a load thereon or displacement thereof. However, the present invention is not limited to the use of such flexures 60. For example, as shown in FIG. 11, three plate springs 65 having an elongate rectangular shape may be used for constraining the position of the table 240 relative to the X-stage 230 (or for connecting them with each other). Each plate springs has a high rigidity in one of three orthogonal directions (i.e., the direction perpendicular to the longitudinal direction) and low rigidities in the other two directions (i.e., the longitudinal direction and the direction normal to its surfaces). In the case where the plate springs 65 of this type are used, it is preferable for the three plate springs 65 to be disposed at respective positions around a circle within which the center of gravity of the table 240 lies. It is also preferable for each of plate springs 65 to be disposed such that the high-rigidity direction of each of plate springs 65 is coincident with a radial line with respect to a circle having its center coincident with the center of gravity of the table 240. Although not shown nor described in detail, the stage apparatus of FIG. 11 comprises three table support assemblies at positions corresponding to the plate springs 65, which have a structure similar to that used in the embodiment of FIG. 8 described above. Thus, as with the stage apparatus according to the embodiment of FIG. 8, the three table support assemblies have respective drive pins, and the drive pins support the table 240 at respective support points substantially just under the respective securing points on the table 240 at which the plate springs 65 are secured to the table 240 (or the positions of the set screws 67 in FIG. 11) and serve to independently drive the support points in the Z-direction.

By virtue of the arrangement described above, the stage apparatus of FIG. 11 may provide constraint forces against motions of the table 240 relative to the X-stage 230, in which the constraint forces are strong against motions of the table 230 relative to the said stage 230 in the X-, Y- and Zθ-directions (the Zθ-direction is the rotational direction about the Z-axis), while weak in the Z-, Xθ- and Yθ-directions (the Xθ- and Yθ-directions are the rotational directions about the X- and Y-axes, respectively). Further, any forces applied to the table 240 in the Z-direction when it is driven by the drive pins will create only compressions and no moment, whereby any deformation of the table 240 may be reduced.

Further, with the stage apparatus according to the fourth embodiment shown in FIG. 11, any harmful deformation of the table, which could be caused when it is driven for motion in the Z-direction (i.e., the direction of the first axis) or for tilting, may be effectively minimized. This is one of the prominent advantages of the stage apparatus unachievable with any prior art stage apparatus.

Although the stage apparatus according to each and any of the embodiments described above is incorporated in an exposure apparatus, the applications of the present invention are not limited to the exposure apparatus. For example, the present invention may be incorporated in various laser process systems such as laser repair machines, as well as in any of other systems and apparatus having a stage and a table mounted on the stage, in which the stage is driven for two-dimensional motions in the X- and Y-directions (or one-dimensional, linear motions) and the table has to be driven for Z-tilting motions.

While the present invention has been described in detail with particular reference to preferred embodiments thereof, it will be understood that the present invention is not limited thereto but variations and modifications can be effected without departing from the spirit and scope of the present invention as defined in the appended claims.

The entire disclosure of Japanese Patent Application No. 8-114192 filed on Apr. 11, 1996 and No. 8-161170 filed on May 31, 1996 including specification, claims, drawings and summary are incorporated herein in reference to its entirety.

What is claimed is:

1. A stage apparatus for movably mounting a table on a stage, comprising:

a table;

a support device which supports said table at a center of gravity of said table;

a drive device which drives said table without contacting said table; and a leveling unit which supports said table at two points apart from the center of gravity of said table and adjusts a tilt of said table with respect to the stage.

2. A stage apparatus according to claim 1, wherein:

said support device comprises a drive mechanism of a contact type for driving said table in a vertical direction.

3. A stage apparatus according to claim 1, wherein:

said support device comprises a drive mechanism including a piezoelectric element for driving said table in a vertical direction.

4. A stage apparatus according to claim 1, wherein:

said drive device is so constructed as to support said table at three points apart from the center of gravity without contacting said table and to drive said table in a vertical direction and in directions for adjustment of a tilt of said table with respect to the stage; and said support device is so constructed as to support said table without contacting said table by imposing on said table constraint forces which are sufficiently weak so as not to interfere with driving of said table as effected by said drive device.

5. A stage apparatus according to claim 1, wherein:

said drive device is a voice coil motor comprising an electromagnetic coil mounted on the stage and a magnet mounted on said table.

6. A stage apparatus for movably mounting a table on a stage, comprising:

a table;

a support device which supports said table at a center of gravity of said table, said support device comprising a drive mechanism of a contact type which drives said table in a vertical direction; and a drive device which drives said table without contacting said table, said drive device comprises a leveling unit which supports said table at two points apart from the center of gravity of said table and adjusts a tilt of said table with respect to the stage.

7. A stage apparatus according to claim 6, wherein:

said levelling unit is a voice coil motor comprising an electromagnetic coil mounted on the stage and a magnet mounted on said table.

8. A stage apparatus for movably mounting a table on a stage, comprising:

a table;

a support device which supports said table at a center of gravity of said table;

a drive device which drives said table without contacting said table;

said drive device being so constructed as to support said table at three points apart from the center of gravity without contacting said table and to drive said table in the vertical direction and in directions for adjustment of a tilt of said table with respect to the stage; and said support device comprises a support mechanism of a contact free type using magnetic repulsive forces for supporting said table with constraint forces which is sufficiency weak so as not to interfere with driving of said table as effected by said drive device.

9. A stage apparatus, comprising:

a stage movable along a reference plane;

a table movable relative to said stage at least in a direction of a first axis perpendicular to said reference plane along with said stage is movable;

at least three drive pins which support said table at least at three different support points and drive said table in the direction of the first axis at the three support points;

at least three resilient members, each of which has at least one concavity, to provide constraint forces against motions of said table relative to said stage, wherein said constraint forces act strongly against motions of said table relative to the stage in directions parallel to the reference plane while being weak in the other directions; and a drive system which drives said drive pins simultaneously or independent.

10. A stage apparatus according to claim 9, wherein:

each of said resilient members is a plate spring having a high rigidity in one of three orthogonal directions and low rigidities in the other two directions.

11. A stage apparatus according to claim 9, wherein:

each of said resilient member is a plate spring which is subject to pantagraph-like deformation when said table is displaced or loaded with a load in the direction of the first axis, the pantagraph-like deformation of said plate spring providing a low rigidity in the direction of the first axis.

12. A stage apparatus, comprising:

a stage movable along a reference plane;

a table movable relative to said stage at least in a direction of a first axis perpendicular to the reference plane along which said stage is movable;

at least three resilient members which constrain position of said table relative to said stage;

at least three drive pins which support said table at respective support points substantially just under respective securing points on said table at which said resilient members are secured to said table and which drive said table in the direction of the first axis at the respective support points; and a drive system which drives said drive pins simultaneously or independently;

wherein each of said resilient members is a plate spring which is subject to pantagraph-like deformation when said table is displaced or loaded with a load in the direction of the first axis, the pantagraph-like deformation of said plate spring providing a low rigidity in the direction of the first axis.

13. A stage apparatus comprising:

a stage movable along a reference plane;

a table movable relative to said stage at least in a direction of a first axis perpendicular to the reference plane along which said stage is movable;

at least three drive pins which support said table at least at three different support points and which drive said table in the direction of the first axis at the three support points;

at least three resilient members, disposed at least at respective three positions along a circle within which a center of gravity of said table lies, which provide constraint forces against motions of said table relative to said stage, wherein said constraint forces act strongly against motions of said table relative to said stage in directions parallel to said reference plane while being weak in other directions; and a drive system which drives said drive pins simultaneously or independently;

wherein each of said resilient members is a plate spring which is subject to pantagraph-like deformation when said table is displaced or loaded with a load in said direction of the first axis, the pantagraph-like deformation of said plate spring providing a low rigidity in the direction of the first axis.

14. An exposure apparatus having a stage apparatus for movably mounting a table on a stage, the table being adapted to hold thereon a photosensitized substrate onto which a pattern formed on a mask is transferred by exposure, wherein said stage apparatus comprises:

a table;

a support device which supports said table at a center of gravity of said table;

a drive device which drives said table supported by said support device without contacting said table; and a leveling unit which supports said table at two points apart from the center of gravity of said table and adjusts a tilt of said table with respect to the stage.

15. An exposure apparatus according to claim 14, wherein:

said support device comprises drive mechanism of a contact type for driving said table in a vertical direction.

16. An exposure apparatus according to claim 14, wherein:

said support device comprises a drive mechanism including a piezoelectric element for driving said table in a vertical direction.

17. An exposure apparatus according to claim 14, wherein:

said drive device is so constructed as to support said table at three points apart from the center of gravity without contacting said table and to drive said table in a vertical direction and in directions for a tilt adjustment of said table with respect to the stage; and said support device comprises a support mechanism of a contact free type for supporting said table with constraint forces which are sufficiently weak so as not to interfere with driving of said table as effected by said drive device.

18. An exposure apparatus according to claim 14, wherein:

said drive device is a voice coil motor comprising an electromagnetic coil mounted on the stage and a magnet mounted on said table.

19. An exposure apparatus having a stage apparatus including a stage and a table movably mounted on the stage, the table being adapted to hold thereon a photosensitized substrate onto which a pattern formed on a mask is transferred by exposure, wherein said stage apparatus comprises:

a table;

a support device which supports said table at a center of gravity of said table, said support device comprising a drive mechanism of a contact type which drives said table in a vertical direction; and a drive device which drives said table without contacting said table, said drive device comprises a leveling unit which supports said table at two points apart from the center of gravity of said table and which adjusts a tilt of said table with respect to the stage.

20. An exposure apparatus according to claim 19, wherein:

said levelling unit is a voice coil motor comprising an electromagnetic coil mounted on the stage and a magnet mounted on said table.

21. An exposure apparatus having a stage apparatus including a stage and a table movably mounted on the stage, the table being adapted to hold thereon a photosensitized substrate onto which a pattern formed on a mask is transferred by exposure, wherein said stage apparatus comprises:

a table;

a support device which supports said table at a center of gravity of said table;

a drive device which drives said table without contacting said table;

said drive device being so constructed as to support said table at three points apart from the center of gravity without contacting said table and to drive said table in a vertical direction and in directions from a tilt adjustment of said table with respect to the stage; and said support device comprises a support mechanism of a contact free type using magnetic repulsive forces for supporting said table with constraint forces which are sufficiently weak so as not to interfere with driving of said table as effected by said drive device.

22. An exposure apparatus having a stage apparatus including a stage movable along a reference plane, the stage being adapted for movably mounting a table thereon, the table being adapted to hold thereon a photosensitized substrate onto which a pattern formed on a mask is transferred by exposure, wherein said stage apparatus comprises:

a table movable relative to said stage at least in a direction of a first axis perpendicular to the reference plane along which the stage is movable;

at least three drive pins which supports said table at least at three different support points and drives said table in the direction of said first axis at the three support points;

at least three resilient members, each of which has at least one concavity, to provide constraint forces against motions of said table relative to the stage, wherein the constraint forces act strongly against motions of said table relative to the stage in directions parallel to the reference plane while being weak in other directions; and a drive which drives said drive pins simultaneously or independently.

23. An exposure apparatus according to claim 22, wherein:

each of said resilient members is a plate spring having a high rigidity in one of three orthogonal directions and low rigidities in the other two directions.

24. An exposure apparatus according to claim 22, wherein:

each of said resilient members is a plate spring which is subject to pantagraph-like deformation when said table is displaced or loaded with a load in the direction of the first axis, the pantagraph-like deformation of said plate spring providing a low rigidity in the direction of the first axis.

25. An exposure apparatus having a stage apparatus including a stage movable along a reference plane, the stage being adapted for mounting a table thereon, said table being adapted to hold thereon a photosensitized substrate onto which a pattern formed on a mask is transferred by exposure, wherein said stage apparatus comprises:

a table movable relative to the stage at least in a direction of a first axis perpendicular to the reference plane along which the stage is movable;

at least three resilient members which constrain position of said table relative to the stage;

at least three drive pins which support said table at respective support points substantially just under respective securing points on said table at which said resilient members are secured to said table and which drives said table in the direction of the first axis at the respective support points; and a drive system which drives said drive pins simultaneously or independently;

wherein each of said resilient members is a plate spring which is subject to pantagraph-like deformation when said table is displaced or loaded with a load in the direction of the first axis, the pantagraph-like deformation of said plate spring providing a low rigidity in the direction of the first axis.

26. An exposure apparatus having a stage apparatus including a stage movable along a reference plane, the stage being adapted for mounting a table thereon, the table being adapted to hold thereon a photosensitized substrate onto which a pattern formed on a mask is transferred by exposure, wherein said apparatus comprises:

a table movable relative to the stage at least in a direction of a first axis perpendicular to the reference plane along which the stage is movable;

at least three drive pins which support said table at least at three different support points and drive said table in the direction of the first axis at the three support points;

at least three resilient members, disposed at least at respective three positions around a circle within which a center of gravity of said table lies, which provide constraint forces against motions of said table relative to said stage, wherein said constraint forces act strongly against motions of said table relative to the stage in directions parallel to the reference plane while being weak in other directions; and a drive system which drives said drive pins simultaneously or independently;

wherein each of said resilient members is a plate spring which is subject to pantagraph-like deformation when said table is displaced or loaded with a load in said direction of the first axis, the pantagraph-like deformation of said plate spring providing a low rigidity in the direction of the first axis.

* * * * *